US009445525B2

United States Patent
Hara et al.

(10) Patent No.: US 9,445,525 B2
(45) Date of Patent: Sep. 13, 2016

(54) POWER SUPPLY DEVICE

(71) Applicant: TDK CORPORATION, Tokyo (JP)

(72) Inventors: Yasuhiro Hara, Tokyo (JP); Wataru Nakahori, Tokyo (JP); Hiroshi Miyazaki, Tokyo (JP); Haruhiko Sanae, Tokyo (JP)

(73) Assignee: TDK CORPORATION, Tokyo (JP)

( * ) Notice: Subject to any disclaimer, the term of this patent is extended or adjusted under 35 U.S.C. 154(b) by 99 days.

(21) Appl. No.: 14/477,401

(22) Filed: Sep. 4, 2014

(65) Prior Publication Data

US 2015/0070845 A1    Mar. 12, 2015

(30) Foreign Application Priority Data

Sep. 6, 2013  (JP) ................................ 2013-185329

(51) Int. Cl.
H05K 7/20    (2006.01)

(52) U.S. Cl.
CPC .......... H05K 7/20254 (2013.01); H05K 7/209 (2013.01); H05K 7/20927 (2013.01)

(58) Field of Classification Search
CPC ..... H05K 7/20; H05K 7/209; H05K 7/20254
USPC ........................................ 361/699, 688, 701
See application file for complete search history.

(56) References Cited

U.S. PATENT DOCUMENTS

| 4,914,833 A * | 4/1990 | Pilolla ................... A47K 10/48 34/202 |
| 5,841,634 A * | 11/1998 | Visser ....................... F28F 3/12 165/104.33 |
| 6,898,072 B2 * | 5/2005 | Beihoff ................... B60L 11/12 257/692 |
| 8,811,015 B2 * | 8/2014 | Wagner .............. H05K 7/20927 165/80.4 |
| 2010/0097765 A1 * | 4/2010 | Suzuki ................... B60K 6/365 361/699 |
| 2011/0193452 A1 | 8/2011 | Yakushiji |

FOREIGN PATENT DOCUMENTS

| JP | 2003-153552 A | 5/2003 |
| JP | 2003-180089 A | 6/2003 |
| JP | 2005-198460 A | 7/2005 |
| JP | 2007-295639 A | 11/2007 |
| JP | 2011-163232 A | 8/2011 |
| JP | 2011-239485 A | 11/2011 |
| JP | A-2013-58556 | 3/2013 |
| JP | 2013-110856 A | 6/2013 |

* cited by examiner

*Primary Examiner* — Dion R Ferguson
*Assistant Examiner* — Mandeep S Buttar
(74) *Attorney, Agent, or Firm* — Oliff PLC

(57) ABSTRACT

In a power supply device 1, a first space R1 and a second space R2 are delimited, a coil component 20 is arranged in the first space R1, and heat-generating components and components having weak resistance to heat are arranged in the second space R2. The power supply device 1 is configured to contain the coil component 20 in the first space R1 so that ambient air of the coil component 20 can contact a first side wall 72, which constitutes the first space R1, making it possible to expect discharge of heat to coolant in a coolant channel W via the first side wall 72. Therefore, heat can be discharged from the ambient air of the coil component, the temperature of which has been raised by heat generation, towards the coolant efficiently.

17 Claims, 7 Drawing Sheets

POWER SUPPLY DEVICE

TECHNICAL FIELD

The present invention relates to a power supply device.

BACKGROUND

During operation of a power supply device mounted on a vehicle, there is an excessively large amount of heat generated by loss, and the like, of an electronic component, e.g. a switching element, inside the power supply device. Therefore, various kinds of cooling methods are considered from a purpose avoiding damage and the like by overheating of the power supply device.

According to an exemplary method for cooling an electronic component mounted on the substrate inside a power supply device, a substrate, on which a component generating a large amount of heat (e.g. semiconductor) is mounted, is placed on a base plate having a coolant channel formed therein, for example. The same method is also used when cooling a coil component including a core such as a transformer or an inductor (for example, refer to Japanese Laid-open Patent Publication No. 2013-58556).

SUMMARY

In connection with cooling of a semiconductor or a rectification element, which generates a large amount of heat, a structure is disclosed which is mounted on a base plate, which is provided with a cooling channel, so that any loss resulting from the semiconductor or the rectification element is directly discharged to cooling water via the base plate. Meanwhile, in the case of a coil component (e.g. transformer or inductor) having smaller loss than a semiconductor, its source of heat generation includes conduction loss (Joule heat) generated from the coil conductor and core loss generated from the core. Heat discharge paths from such a coil component include a heat discharge path resulting from heat conduction from the coil component to the base plate and a heat discharge path from the surface of the core or the coil into the air. In this case, the heat conductivity of ferrite, which constitutes the core, is as low as 1/20 or lower compared with metal such as aluminum alloy, so that heat is hardly transferred inside the core. As a result, core loss resulting from the upper-side core, which constitutes a coil component, has a higher ratio of heat discharged from the core surface into ambient air than that discharged to the base plate via the lower-side core. This causes, despite the fact that the loss of the coil component is 1/10 or lower compared with large loss of the semiconductor, a temperature rise of air inside the power supply device, thereby affecting other electronic components.

The present invention has been made based on the above description, and an aspect of the present invention is to provide a power supply device capable of effectively suppressing any rise of temperature of the atmosphere inside the device.

According to an aspect of the present invention, there is provided a power supply device including: a housing having a first bottom surface, a first side wall extending upwards from a peripheral edge of the first bottom surface, a second bottom surface provided on the first side wall above the first bottom surface, a second side wall extending upwards from a peripheral edge of the second bottom surface, and a coolant channel provided below the second bottom surface so that coolant flows through the coolant channel; a main substrate contained in an interior of the housing, the main substrate having electronic components provided on a first main surface, a part of a second main surface, which is opposite the first main surface, being arranged on the second bottom surface of the housing while facing the second bottom surface; and a coil component contained in the interior of the housing and electrically connected to the main substrate, wherein the interior of the housing is delimited into a first space, which is surrounded by the first bottom surface and the first side wall, and a second space, which is provided above the first space and surrounded by the second bottom surface and the second side wall, the coil component is arranged in the first space, and the electronic components provided on the first main surface of the main substrate are arranged in the second space.

In connection with the power supply device according to an aspect of the present invention, the interior of the housing is delimited into a first space and a second space, the coil component is arranged in the first space, and heat-generating components and electronic components having weak resistance to heat are arranged in the second space. Such a configuration of containing the coil component in the first space enables ambient air of the coil component to contact the first side wall, making it possible to expect discharge of heat to coolant in the coolant channel via the first side wall. This results in efficient discharge of heat from ambient air of the coil component, the temperature of which has risen due to heating, towards the coolant and makes it possible to prevent any rise of air temperature around the main substrate, on which components having weak resistance to heat (e.g. electrolytic capacitors) are mounted, i.e. air temperature in the second space.

As a configuration for effectively exhibiting the above-mentioned function, specifically, the first space and the second space can be delimited by the main substrate.

In addition, as another configuration for effectively exhibiting the above-mentioned function, specifically, the first space and the second space can be delimited by a heat shield plate, and the main substrate can be arranged on a side of the second space. Such reliable delimitation using the heat shield plate can prevent any leak of ambient air of the coil component into the second space on the main substrate side. In addition, more reliable delimitation of the first space and the second space by the heat shield plate limits the path of heat discharge from the first space and thereby increases the difference between air temperature inside the first space and coolant temperature, making it possible to further improve performance of heat discharge from air inside the first space to the coolant via the first side wall.

In addition, the electronic components can be heat-generating components and electronic components having weak resistance to heat.

The heat shield plate can be provided at the substantially same height as the second bottom surface, or it can be provided below the second bottom surface. Such a configuration can reduce the area of the heat shield plate, which is for the purpose of delimiting first and second spaces.

In addition, the heat shield plate can have an opening near its peripheral edge so that a connection member, which connects the coil component and the main substrate, extends through the opening. This configuration, compared with a case of providing the opening near the center of the heat shield plate, makes convection of gas inside the first space, which reaches a high temperature, to the second space more difficult and can suppress heating of the heat-generating component on the first main surface of the main substrate.

In addition, the heat shield plate can have a pressing member on its lower surface side to fix the coil component. Such a structure of attaching a pressing member and pressing/fixing a coil winding to the housing makes it possible to fix the coil component to the housing in a reliable manner, to reduce contact thermal resistance between the coil component and the housing, and to improve characteristics of heat discharge from the coil component to the coolant via the housing. Such improvement of heat discharge characteristics of the coil component can also prevent any rise of ambient temperature of the coil component.

In addition, the coolant channel can be provided along the first side wall above the first bottom surface. Such provision of the coolant channel on the second bottom surface, particularly along the first side wall above the first bottom surface, makes it possible to arrange the first side wall and the coolant channel closer to each other and to facilitate discharge of heat from the air inside the first space via the first side wall.

In addition, lower surfaces of the electronic components, which are provided on the first main surface of the main substrate, can be arranged on the second bottom surface of the housing so that heat can be discharged to the coolant channel. This configuration can facilitate discharge of heat from electronic components generating a large amount of heat, in particular, to the coolant channel.

According to the present invention, a power supply device is provided which can effectively suppress any rise of temperature of the atmosphere inside the device.

DETAILED DESCRIPTION

Figure 1:
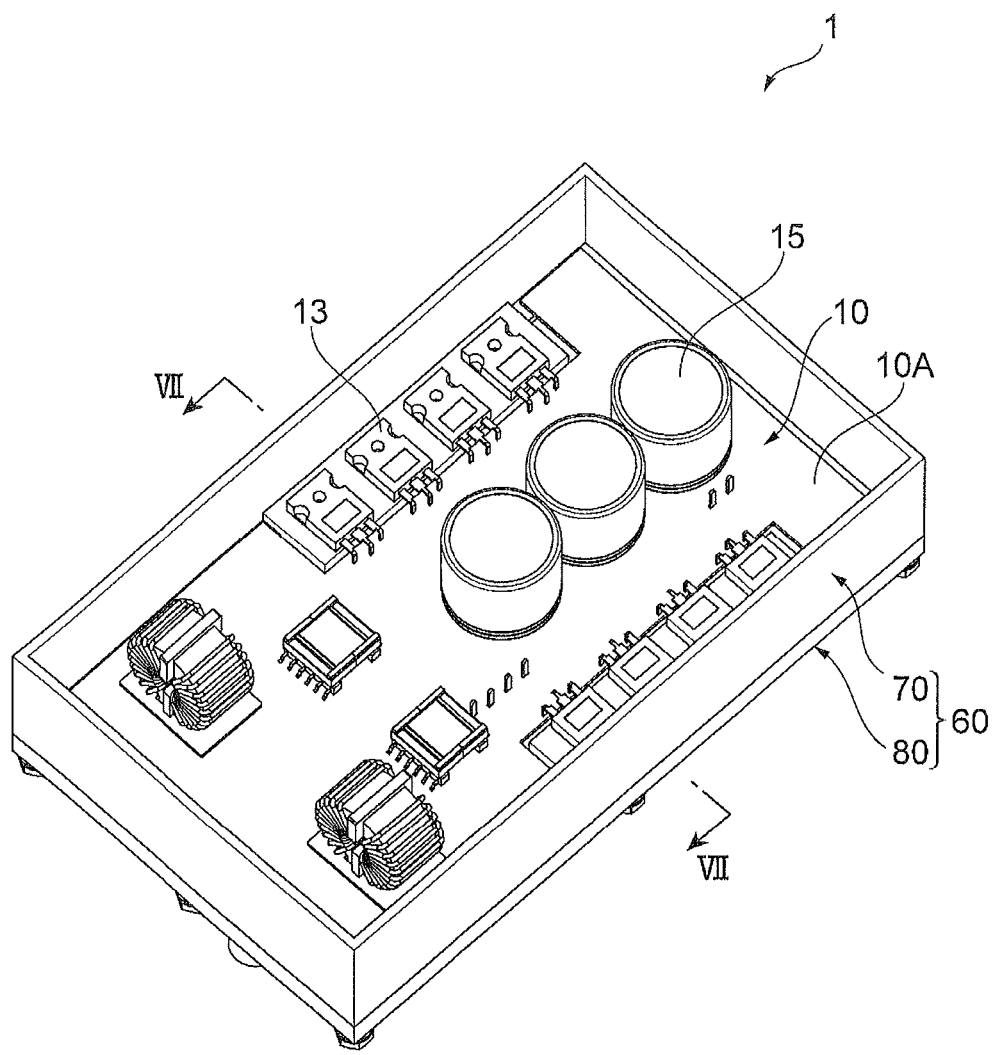
FIG. 1 is a perspective view illustrating a schematic construction of a power supply device according to an embodiment of the present invention.

Hereinafter, embodiments of the present invention will be described in detail with reference to the accompanying drawings. In connection with descriptions of the drawings, the same components are given the same reference numerals, and repeated descriptions thereof will be omitted.

Figure 2:
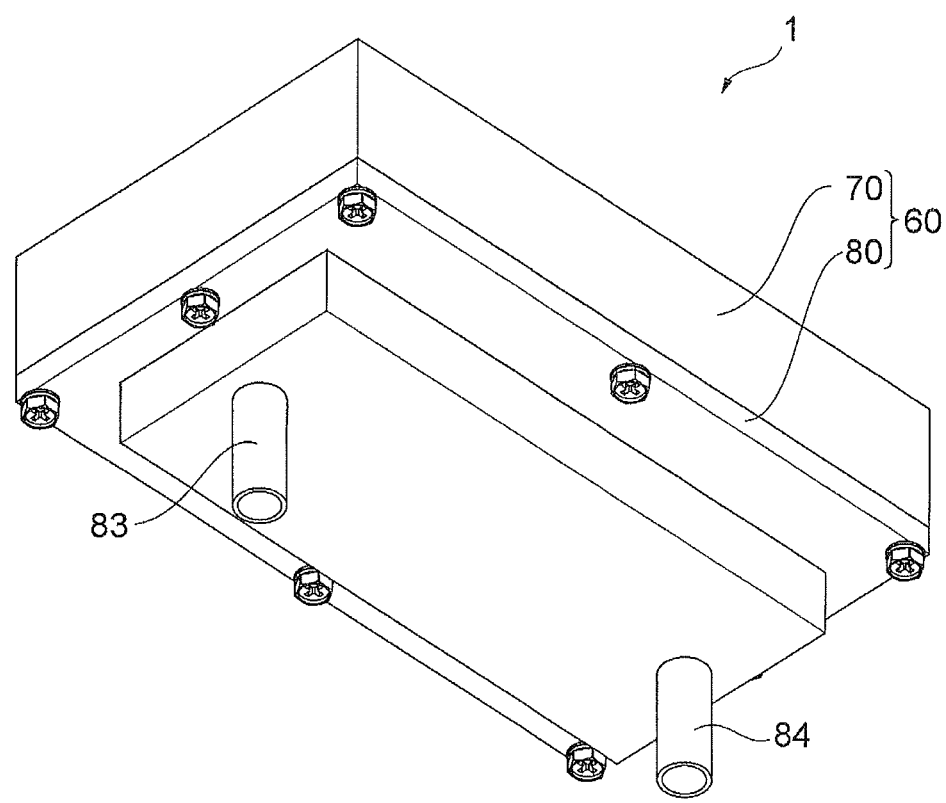
FIG. 2 is a schematic perspective view seen from below the power supply device.

FIG. 1 is a perspective view illustrating a schematic construction of a power supply device according to an embodiment of the present invention. In addition, FIG. 2 is a schematic perspective view seen from below the power supply device of FIG. 1. An example of the power supply device described in the present embodiment is, for example, a switching power supply device that performs voltage conversion (step-down) of a DC voltage, which is inputted from a high-voltage battery connected to an input terminal, and generates a desired DC output voltage.

The power supply device 1 includes electronic components, such as an input smoothing capacitor, a switching element, a transformer, a rectification circuit, an output smoothing capacitor, an inductor, and a controller, which are mounted on a main substrate 10 (main circuit substrate) and contained in a housing 60. Among them, the transformer and the inductor are so-called coil components including windings and cores around which the windings are wound. In the example illustrated in FIG. 1, a semiconductor 13, which functions as a switching element for example, and a capacitor 15, which functions as an input smoothing capacitor or an output smoothing capacitor, are attached on a surface 10A (first main surface) of the main substrate 10. Either of the semiconductor 13 and the coil component corresponds to a heat-generating component that reaches a high temperature during driving.

Figure 3:
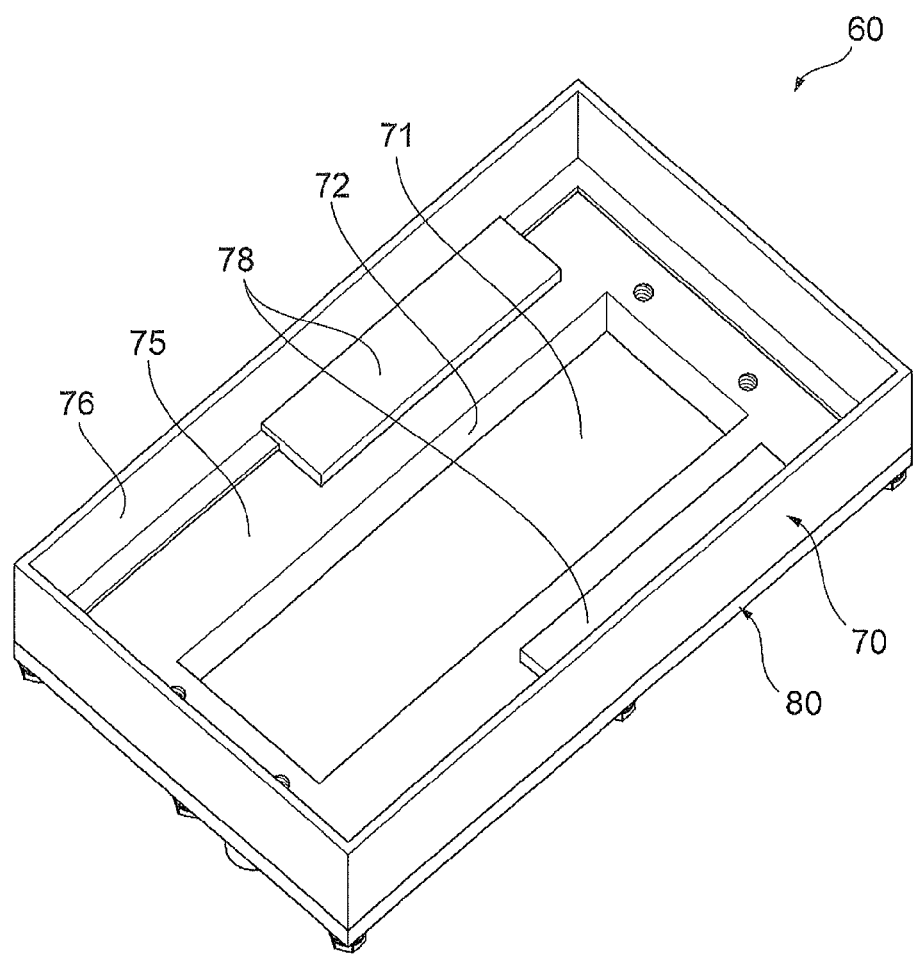
FIG. 3 is a perspective view illustrating a schematic construction of a housing of the power supply device.
Figure 4:
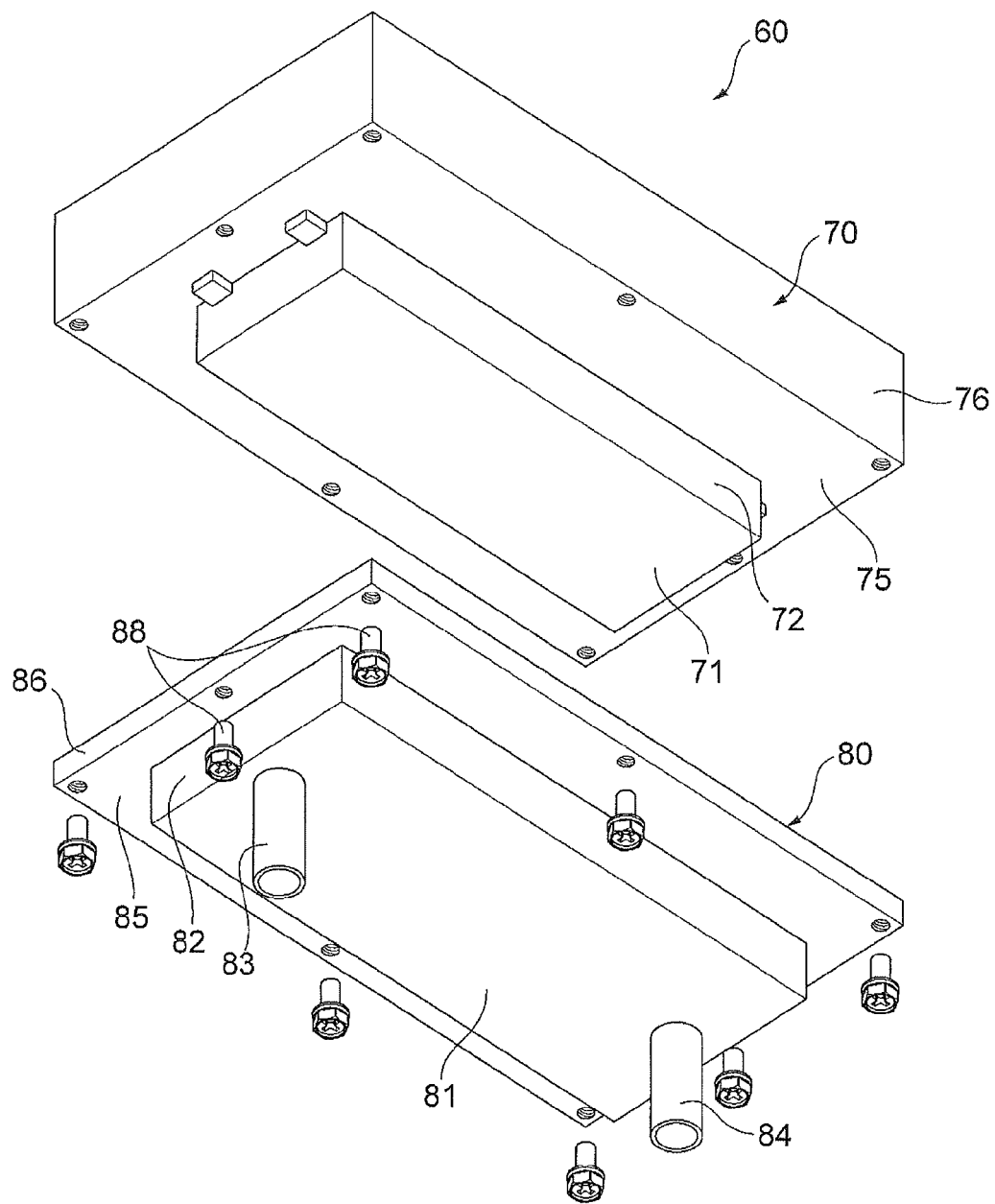
FIG. 4 is a schematic perspective view, seen from below, illustrating schematic constructions of a base plate and a channel cover, which constitute the housing.

The housing 60 of the power supply device 1 will now be described with reference to FIGS. 2-4. The housing 60 constitutes a part of a metallic case containing component members of the power supply device 1. FIG. 3 is a perspective view illustrating a schematic construction of the housing of the power supply device, and FIG. 4 is a schematic perspective view, seen from below, illustrating schematic constructions of a base plate and a channel cover, which constitute the housing. In the case of the power supply device 1, the above-mentioned electronic components are contained inside the housing 60 and are covered by a cover 90 (refer to FIG. 7) from above. The housing 60 is made of metal, such as aluminum, and includes a base plate 70, which constitutes the bottom surface of an area containing electronic components and the like, and a channel cover 80 attached to the rear surface side of the base plate 70 (lower side of FIG. 1 and FIG. 2, which is opposite the side on which electronic components and the like are contained).

The base plate 70 includes, as illustrated in FIGS. 3 and 4, a first bottom surface 71, a first side wall 72 extending upwards from the peripheral edge of the first bottom surface 71, a second bottom surface 75 formed above the first bottom surface 71 to be continuous with the first side wall 72, and a second side wall 76 extending upwards from the peripheral edge of the second bottom surface 75. As such, the base plate 70 has bottom surfaces of different heights, i.e. first bottom surface 71 and second bottom surface 75. The power supply device 1 according to the present embodiment is also shaped, when seen from above, in such a manner that the second bottom surface 75 is formed along the outer periphery of the first bottom surface 71. The base plate 70 also includes a semiconductor abutting portion 78 formed above the second bottom surface 75 so as to abut the above-mentioned semiconductor 13.

The channel cover 80, which is attached to the rear surface side of the base plate 70, is shaped to cover the rear surface side of the base plate 70 and is thereby attached to the base plate 70 so that its outer periphery alone is spaced from the rear surface of the base plate 70 to form a coolant channel between it and the rear surface side of the base plate 70.

The channel cover 80 includes, as illustrated in FIG. 4 and the like, a first bottom surface 81, a first side wall 82 extending upwards from the peripheral edge of the first bottom surface 81, a second bottom surface 85 formed above the first bottom surface 81 to be continuous with the first side wall 82, and a second side wall 86 extending upwards from the peripheral edge of the second bottom surface 85. The channel cover 80 is then attached to the base plate 70 and fixed by screws 88 so that its second side wall 86 is continuous with the second side wall 76 of the base plate 70.

In addition, the first bottom surface 81 of the channel cover 80 is provided with an inlet port 83 and an outlet port 84 for allowing coolant to flow between the base plate 70 and the channel cover 80, so that coolant is introduced from the outside via the inlet port 83 and, after flowing through a coolant channel W (also refer to FIG. 7) inside the housing 60, discharged to the outside from the outlet port 84.

Figure 5:
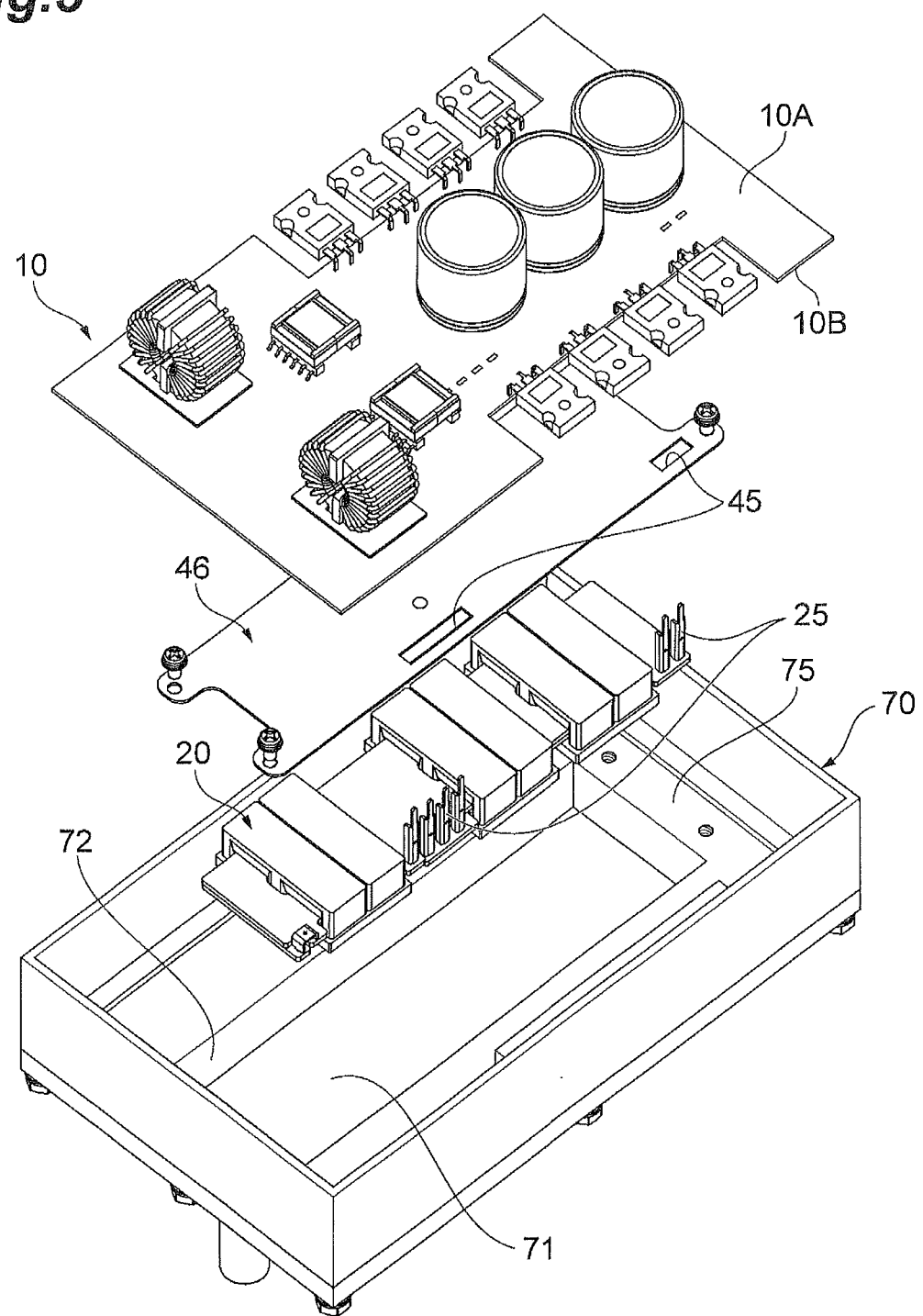
FIG. 5 is an exploded perspective view illustrating assembly of electronic components inside the housing.
Figure 6:
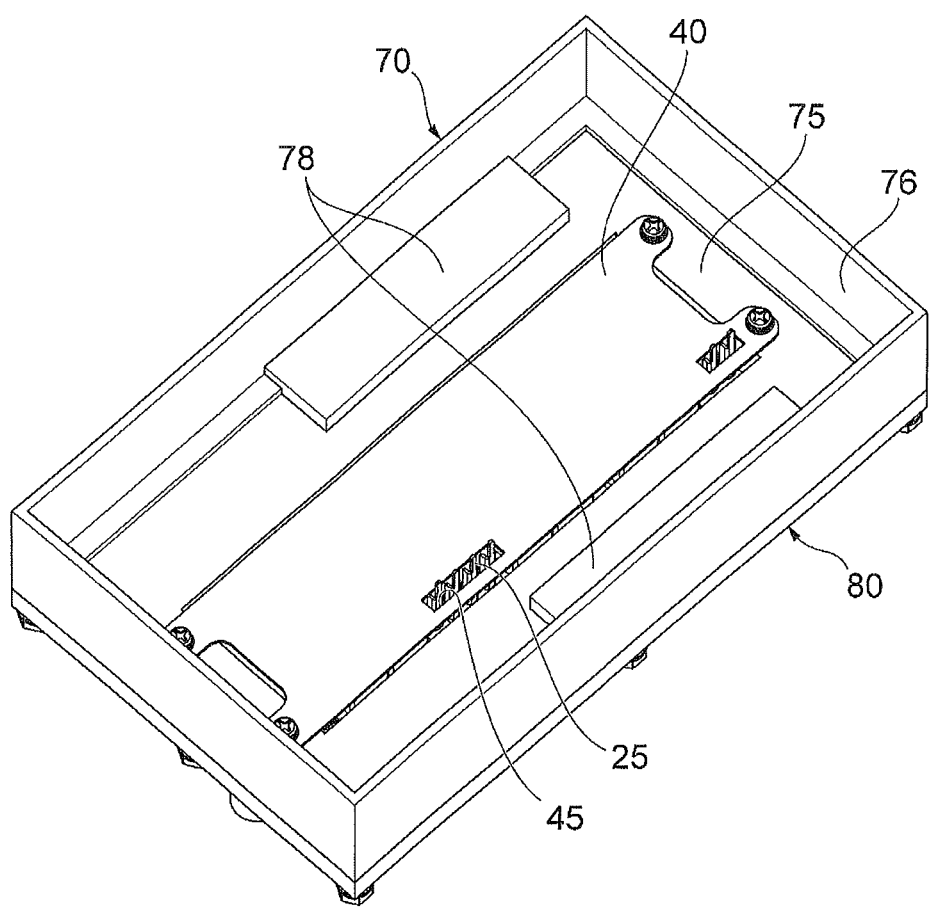
FIG. 6 is a schematic perspective view illustrating a coil component and a heat discharge plate attached to the housing.
Figure 7:
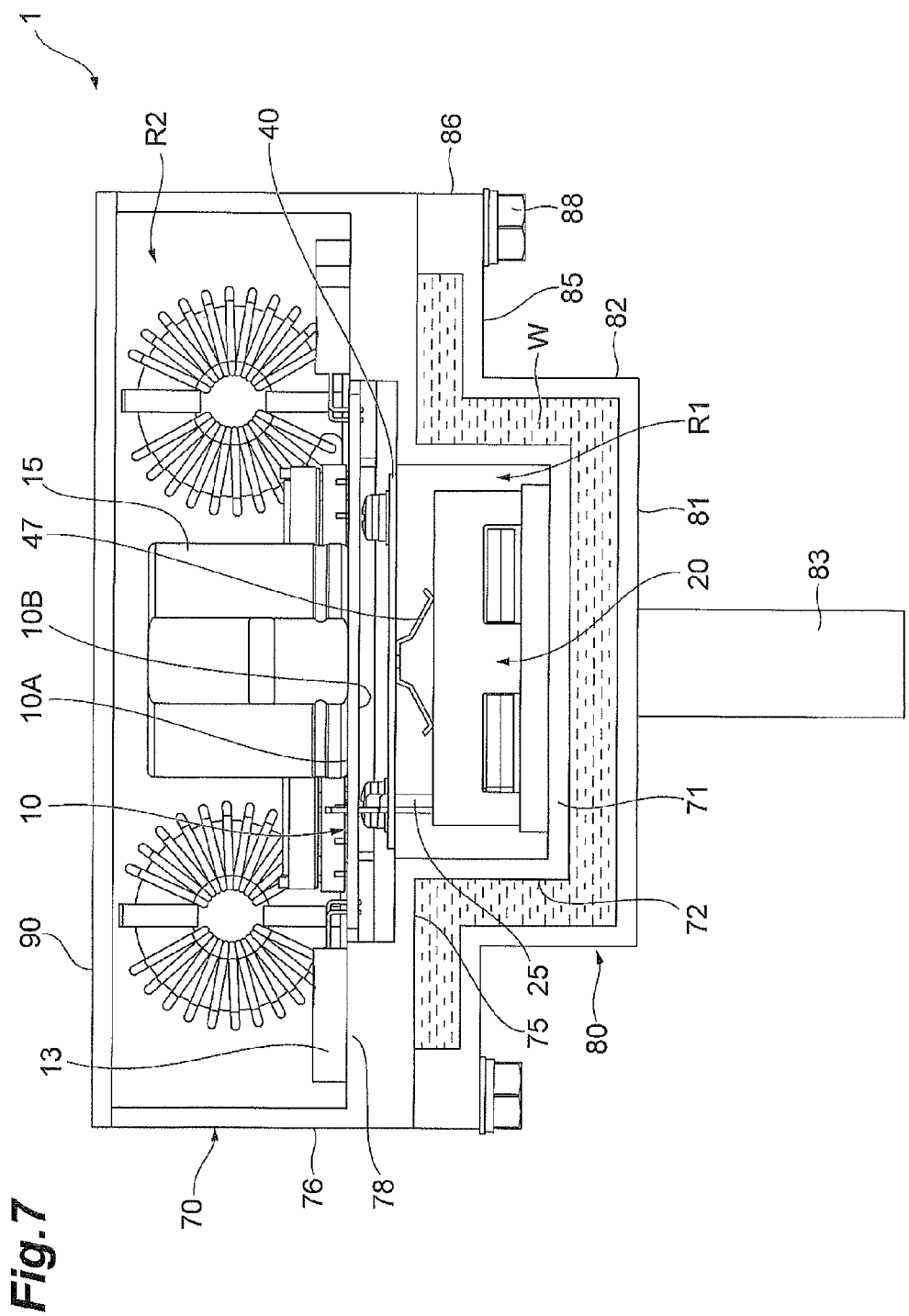
FIG. 7 is a view taken along arrows VII-VII of FIG. 1.

Next, electronic components contained inside the housing 60, i.e. in the base plate 70, as well as a method for containing them, will be described with reference to FIGS. 5-7. FIG. 5 is an exploded perspective view illustrating assembly of electronic components inside the housing, FIG. 6 is a schematic perspective view illustrating a coil component and a heat discharge plate attached to the housing, and FIG. 7 is a view taken along arrows VII-VII of FIG. 1.

Inside the base plate 70, a main substrate 10, which has a semiconductor 13 (a heat generating component) and a capacitor 15 on its surface, and a coil component 20 are contained. As illustrated in FIG. 5, the main substrate 10 has an area larger than the bottom area of the first bottom surface 71 so that it is installed on the second bottom surface 75 when contained. In addition, the coil component 20 is shaped so that it can be contained in a space surrounded by the first bottom surface 71 and the first side wall 72. In addition, the coil component 20 and the main substrate 10 are electrically connected by a connection member 25, such as a bus bar or a connection terminal, for example. The connection member 25 is formed to extend upwards not from near the center of the coil component 20, but from near its peripheral edge, so that, when the coil component 20 is placed on the first bottom surface 71 inside the base plate 70, the connection member 25 is positioned to extend upwards along the first side wall 72.

A metallic heat shield plate 40 is attached between the coil component 20 and the main substrate 10. The heat shield plate 40 has a shape approximately corresponding to that of the first bottom surface 71 of the base plate 70 and has a function of delimiting a space surrounded by the first bottom surface 71 and the first side wall 72 (first space) and a space above it, that is, a space surrounded by the second bottom surface 75 and the second side wall 76 (second space). That is, inside the base plate 70, the coil component 20, the heat shield plate 40, and the main substrate 10 are contained from below in that order.

The heat shield plate 40 has an opening 45 formed near its peripheral edge so that a connection member 25, which connects the coil component 20 and the main substrate 10, is inserted through the opening 45. Since the heat shield plate 40 is a member for delimiting the first and second spaces, the material or thickness of the heat shield plate 40 can be varied as long as it exhibits such functions. In addition, the heat shield plate 40 can have a pressing member 47 on its rear surface side to fix the coil component 20 (refer to FIG. 7). Such use of the pressing member 47 makes it possible to press/fix the coil component 20, which is provided below the heat shield plate 40, and to support the coil component 20 more stably.

FIG. 6 illustrates a state in which the coil component 20 is placed on the first bottom surface 71 of the base plate 70, and the heat shield plate 40 is attached thereon. As illustrated in FIG. 6, the coil component 20 is contained in the space surrounded by the first bottom surface 71 and the first side wall 72, and its upper surface is covered by the heat shield plate 40. The heat shield plate 40 is fixed, at its ends, to the second bottom surface 75 of the base plate 70 by screws. As a result, an approximately flat surface is formed by the second bottom surface 75 and the upper surface of the heat shield plate 40. By attaching the heat shield plate 40 to the base plate 70, furthermore, the connection member 25 is inserted through the opening 45 provided near the peripheral edge of the heat shield plate 40.

The main substrate 10 is placed on the upper side of a surface, which is formed by the second bottom surface 75 of the base plate 70 and the upper surface of the heat shield plate 40. In this case, a part of the second main surface 10B that is opposite the first main surface 10A, on which the semiconductor 13, the capacitor 15, and the like are provided, is positioned to face the second bottom surface 75 of the base plate 70. In addition, the semiconductor 13, which is attached to the main substrate 10, is positioned to be thermally connected to a semiconductor abutting portion 78 of the base plate 70 via a heat transfer member, such as a heat discharge sheet or a thermal compound.

The arrangement of various electronic components, when the coil component 20, the heat shield plate 40, and the main substrate 10 have been arranged in the housing 60 as described above, and the cooling situation will be described with reference to FIG. 7.

As illustrated in FIG. 7, the interior of the housing 60 (interior of the base plate 70) is delimited by the heat shield plate 40 into a first space R1, which is surrounded by the first bottom surface 71 and the first side wall 72, and a second space R2, which is provided above the first space R1, and which is surrounded by the second bottom surface 75 and the second side wall 76. The coil component 20 is then contained in the first space R1, and the main substrate 10 and electronic components (a heat-generating component, such as a semiconductor 13, and a component having weak resistance to heat, such as a capacitor 15 or a control IC) on the main substrate are arranged in the second space R2. As used herein, the component having weak resistance to heat refers to a component which has a possibility of being damaged or malfunctioning, unless maintained at a temperature of 105° C. or lower, for example, or the life of which can be shortened.

In addition, a coolant channel W, which is formed by the base plate 70 and the channel cover 80, and through which coolant flows, is provided below the second bottom surface 75 of the base plate 70. Specifically, the coolant channel W is provided below the second bottom surface 75, outside the first side wall 72, and beneath the first bottom surface 71. As coolant flows through the coolant channel W, heat from the heat-generating component, the main substrate 10, and the coil component 20 is transferred to the coolant via the base plate 70 and discharged to the outside.

The power supply device 1 according to the present embodiment has a first space R1 and a second space R2 delimited so that a coil component 20 is arranged in the first space R1, while a heat-generating component is arranged in the second space R2; as a result of this configuration, heat generated from the coil component 20 (conduction loss, core loss) is discharged from the bottom surface of the coil component 20 to coolant in the coolant channel W directly through the base plate 70 (first path) and, particularly, from the upper portion of the coil component 20 to inner air of the first space R1 (second path). It is possible that, among these, heat discharged to the inner air will raise the temperature of the inner air. Considering this, the power supply device 1 is configured to contain the coil component 20 in the first space R1, so that ambient air of the coil component 20 can contact the first side wall 72. This makes it possible to expect discharge of heat to coolant in the coolant channel W via the first side wall 72. Therefore, heat can be discharged from the ambient air of the coil component, the temperature of which has been raised by heat generation, towards the coolant efficiently, making it possible to prevent any rise of air temperature around the main substrate 10, on which a component having weak resistance to heat (e.g. electrolytic capacitor 15) is mounted, i.e. air temperature in the second space R2.

The power supply device 1 according to the present embodiment also has, as a method for further preventing any rise of ambient temperature of the main substrate 10 caused by heat generated from the coil component 20, a heat shield plate 40 inserted between the first space R1, in which the coil component 20 is contained, and the second space R2, in which a heat-generating component is contained. This can minimize the amount of convection of ambient air of the coil component 20 towards the second space R2 near the main substrate 10. In addition, more reliable delimitation of the first space R1 and the second space R2 by the heat shield plate 40 captures most heat, which is generated by the coil component 20, inside the first space R1 so that the resulting large difference between air temperature inside the first space R1 and coolant temperature can further improve performance of heat discharge from air inside the first space R1 to the coolant through the first side wall 72.

When the heat shield plate 40 is used to delimit the first space R1 and the second space R2, the heat shield plate 40 is preferably provided at the substantially same height as the second bottom surface 75 or below the second bottom surface 75. Such a configuration makes it possible to reduce the area of the heat shield plate, which is for the purpose of delimiting the first space R1 and the second space R2.

The first space R1 and the second space R2 can also be delimited by the main substrate 10, not by the heat shield plate 40. Delimitation of the first space R1 and the second space R2 by the main substrate 10 in this case also makes it possible to suppress additional transfer of heat, among heat (conduction loss, core loss) generated from the coil component 20, from a path of heat, which is discharged from the upper portion of the coil component 20 to inner air of the first space R1, to inner air of the second space R2.

The heat shield plate 40 has an opening 45 near its peripheral edge, through which a connection member 25 connecting the coil component 20 and the main substrate 10 is to be inserted, and this configuration, compared with a case of providing the opening 45 near the center of the heat shield plate 40, makes convection of gas inside the first space R1, which reaches a high temperature, to the second space R2 more difficult and can suppress heating of the heat-generating component on the first main surface 10A of the main substrate 10.

When a pressing member 47 for pressing the coil component 20 is attached to the side of a surface (lower surface side) of the heat shield plate 40, on which the coil component 20 is placed, and when the coil component 20 is thereby pressed/fixed to the base plate 70, it is possible to fix the coil component 20 to the base plate 70 in a reliable manner, to reduce contact thermal resistance between the coil component 20 (particularly, lower-side core) and the base plate 70, and to improve characteristics of heat discharge from the coil component 20 to the coolant via the first bottom surface 71 of the base plate 70. Such improvement of heat discharge characteristics of the coil component 20 can also prevent any rise of ambient temperature of the coil component 20.

In the above embodiment, furthermore, the coolant channel W is provided below the second bottom surface 75, particularly, it is provided along the first side wall 72 above the first bottom surface 71. This makes it possible to arrange the first side wall and the coolant channel W closer to each other and to facilitate discharge of heat from the air inside the first space R1 via the first side wall 72.

Although an embodiment of the present invention has been described above, the power supply device according to the present invention is not limited to the above description, and various modifications can be made.

For example, although it has been assumed in the above description of the power supply device 1 according to the present embodiment that, when seen from above, the second bottom surface 75 is formed along the outer periphery of the first bottom surface 71, the positional relationship of the first bottom surface 71 and the second bottom surface 75 is not limited thereto. In addition, the shape is not specifically limited as long as at least two bottom surfaces having different heights (first and second bottom surfaces) are provided, the inner space of the housing is delimited into two based on the first bottom surface, a first side wall, the second bottom surface, and a second side wall, a coil component is arranged in a space (first space) including one of the bottom surfaces on the deep side (lower side), and a heat-generating component on a substrate is arranged in the other space (second space).

In addition, the first side wall 72 may be slanted, not perpendicular, with regard to the first bottom surface 71, for example, or the first side wall may have a level difference. In short, such variations can be made as long as the first space R1 is provided substantially by the first bottom surface 71 and the first side wall 72.

Furthermore, although the second side wall 76 is provided on the base plate 70 in the case of the power supply device 1 according to the present embodiment, the second side wall 76 can also be provided on the cover 90 to form the second space R2.

In addition, the opening 45, through which the connection member 25 is to be inserted, may be formed as a U-shaped trench, one side of which is a cutout extending to an end side of the heat shield plate 40.

In addition, although the coil component 20 alone is arranged in the first space R1 in the above-described embodiment, not only the coil component 20, but also other electronic components having resistance to high temperature can be arranged in the first space R1. Such electronic components include, for example, resistors, etc.

What is claimed is:

1. A power supply device comprising:
    a housing having a first bottom surface, a first side wall extending upwards from a peripheral edge of the first bottom surface, a second bottom surface provided on the first side wall above the first bottom surface, a second side wall extending upwards from a peripheral edge of the second bottom surface, and a coolant channel provided below the second bottom surface so that coolant flows through the coolant channel;
    a main substrate contained in an interior of the housing, wherein electronic components are provided on a first main surface and a part of a second main surface, which is opposite the first main surface, is arranged on the second bottom surface of the housing while facing the second bottom surface; and
    a coil component contained in the interior of the housing and electrically connected to the main substrate, wherein
    the interior of the housing is delimited into a first space surrounded by the first bottom surface and the first side wall, and a second space provided above the first space and surrounded by the second bottom surface and the second side wall, the coil component is arranged in the first space, the electronic components provided on the first main surface of the main substrate are arranged in the second spacer, and the coolant channel is provided along the first side wall above the first bottom surface.

2. The power supply device according to claim 1, wherein the first space and the second space are delimited by the main substrate.

3. The power supply device according to claim 1, wherein the first space and the second space are delimited by a heat shield plate, and the main substrate is arranged on a side of the second space.

4. The power supply device according to claim 1, wherein the electronic components are heat-generating components and components having weak resistance to heat.

5. The power supply device according to claim 3, wherein the heat shield plate is provided at the substantially same height as the second bottom surface or below the second bottom surface.

6. The power supply device according to claim 3, wherein the heat shield plate has an opening near its peripheral edge so that a connection member, which connects the coil component and the main substrate, extends through the opening.

7. The power supply device according to claim 3, wherein the heat shield plate has a pressing member on its lower surface side to fix the coil component.

8. The power supply device according to claim 1, wherein lower surfaces of the electronic components provided on the first main surface of the main substrate are arranged on the second bottom surface of the housing so that heat is discharged to the coolant channel.

9. The power supply device according to claim 5, wherein the heat shield plate has an opening near its peripheral edge so that a connection member, which connects the coil component and the main substrate, extends through the opening.

10. A power supply device comprising: a housing including a base plate, the base plate having a first bottom surface, a first side wall extending upwards from a peripheral edge of the first bottom surface, a second bottom surface provided on the first side wall above the first bottom surface, a second side wall extending upwards from a peripheral edge of the second bottom surface, and a coolant channel provided below the second bottom surface so that coolant flows through the coolant channel; a main substrate contained in an interior of the housing, wherein electronic components are provided on a first main surface and a part of a second main surface, which is opposite the first main surface, is arranged on the second bottom surface of the housing while facing the second bottom surface; and a coil component contained in the interior of the housing and electrically connected to the main substrate, wherein the interior of the housing is delimited into a first space surrounded by the first bottom surface and the first side wall, and a second space provided above the first space and surrounded by the second bottom surface and the second side wall, the coil component is arranged in the first space, the electronic components provided on the first main surface of the main substrate are arranged in the second space, and lower surfaces of the electronic components provided on the first main surface of the main substrate are thermally connected to a metal abutting portion of the base plate which abuts the electronic components and an end portion of which is part of the second side wall, and heat from the electronic components is discharged to the coolant channel via the abutting portion, and wherein the coolant channel is provided along the first side wall above the first bottom surface.

11. The power supply device according to claim 10, wherein the first space and the second space are delimited by the main substrate.

12. The power supply device according to claim 10, wherein the first space and the second space are delimited by a heat shield plate, and the main substrate is arranged on a side of the second space.

13. The power supply device according to claim 10, wherein the electronic components are heat-generating components and components having weak resistance to heat.

14. The power supply device according to claim 12, wherein the heat shield plate is provided at the substantially same height as the second bottom surface or below the second bottom surface.

15. The power supply device according to claim 12, wherein the heat shield plate has an opening near its peripheral edge so that a connection member, which connects the coil component and the main substrate, extends through the opening.

16. The power supply device according to claim 12, wherein the heat shield plate has a pressing member on its lower surface side to fix the coil component.

17. The power supply device according to claim 14, wherein the heat shield plate has an opening near its peripheral edge so that a connection member, which connects the coil component and the main substrate, extends through the opening.

* * * * *